(12) United States Patent
Hagiwara et al.

(10) Patent No.: US 9,922,952 B2
(45) Date of Patent: Mar. 20, 2018

(54) METHOD FOR PRODUCING SEMICONDUCTOR DEVICE, AND WIRE-BONDING APPARATUS

(71) Applicant: SHINKAWA LTD., Tokyo (JP)

(72) Inventors: Yoshihito Hagiwara, Tokyo (JP); Nobuo Takahashi, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 35 days.

(21) Appl. No.: 15/239,848

(22) Filed: Aug. 18, 2016

(65) Prior Publication Data

US 2016/0365330 A1    Dec. 15, 2016

Related U.S. Application Data

(63) Continuation of application No. PCT/JP2015/053667, filed on Feb. 10, 2015.

(30) Foreign Application Priority Data

Feb. 21, 2014   (JP) ................. 2014-032107

(51) Int. Cl.
*B23K 31/02* (2006.01)
*H01L 23/00* (2006.01)
*B23K 20/00* (2006.01)

(52) U.S. Cl.
CPC ............ *H01L 24/78* (2013.01); *B23K 20/005* (2013.01); *H01L 24/85* (2013.01); *H01L 24/48* (2013.01);

(Continued)

(58) Field of Classification Search
CPC ......... H01L 24/78; H01L 24/85; H01L 24/48; H01L 2224/85947; H01L 2224/7855;

(Continued)

(56) References Cited

U.S. PATENT DOCUMENTS 3,289,452 A  * 12/1966  Kollner ................. H01L 24/48
                                                          140/93 R
4,068,371 A  *  1/1978  Miller .................... H01L 24/85
                                                          228/180.5

(Continued)

FOREIGN PATENT DOCUMENTS

| JP | 60035526 A | * 2/1985 | ............ H01L 24/85 |
| JP | H04-251948 | 9/1992 | |
| JP | H07-235562 | 9/1995 | |
| JP | 2003318216 | 11/2003 | |
| WO | 2009096950 | 8/2009 | |

*Primary Examiner* — Kiley Stoner
(74) *Attorney, Agent, or Firm* — JCIPRNET

(57) ABSTRACT

A method of manufacturing a semiconductor device is provided. A bonding tool with a wire tail extending out of the tip thereof is lowered to bring the tip of the wire tail into contact with a bonding surface of the semiconductor device. Next, the bonding tool in a direction intersecting with the axial direction of the bonding tool (Z direction) is moved to bend the wire tail with the tip of the wire tail in contact with the bonding surface. Then the bonding tool is lowered to form the wire tail into a predetermined shape such that the tip of the wire tail points upward. And then, a wire looping step, a second bonding step and a wire cutting step are performed. This allows the wire tail to be formed easily and efficiently into a predetermined shape.

13 Claims, 8 Drawing Sheets

(52) U.S. Cl.
CPC ............... *H01L 2224/48095* (2013.01); *H01L 2224/48227* (2013.01); *H01L 2224/48472* (2013.01); *H01L 2224/7855* (2013.01); *H01L 2224/78301* (2013.01); *H01L 2224/78353* (2013.01); *H01L 2224/85181* (2013.01); *H01L 2224/85205* (2013.01); *H01L 2224/85947* (2013.01); *H01L 2924/00014* (2013.01)

(58) Field of Classification Search
CPC . H01L 2224/85205; H01L 2224/78353; H01L 2924/00014; H01L 2224/48095; H01L 2224/85181; H01L 2224/48227; H01L 2224/48472; B23K 20/004; B23K 20/005; B23K 20/007
USPC ............ 228/102–103, 8–12, 180.5, 4.5, 904
See application file for complete search history.

(56) References Cited

U.S. PATENT DOCUMENTS

| | | | | |
|---|---|---|---|---|
| 4,976,392 | A * | 12/1990 | Smith | B23K 20/004 228/1.1 |
| 5,365,657 | A * | 11/1994 | Brown | B26D 7/26 156/433 |
| 6,667,625 | B1 * | 12/2003 | Miller | B23K 20/004 228/104 |
| 2002/0023942 | A1 * | 2/2002 | Terakado | B23K 20/005 228/180.5 |
| 2009/0127317 | A1 * | 5/2009 | Siepe | B23K 20/004 228/110.1 |
| 2010/0230809 | A1 | 9/2010 | Calpito et al. | |
| 2015/0243627 | A1 * | 8/2015 | Akiyama | H01L 24/78 228/102 |
| 2016/0351537 | A1 * | 12/2016 | Sekine | H01L 21/48 |

* cited by examiner

METHOD FOR PRODUCING SEMICONDUCTOR DEVICE, AND WIRE-BONDING APPARATUS

CROSS REFERENCE TO RELATED APPLICATIONS

This application is a Continuation of PCT International Application No. PCT/JP2015/053667, filed on Feb. 10, 2015, which claims priority under 35 U.S.C § 119(a) to Patent Application No. 2014-032107, filed in Japan on Feb. 21, 2014, all of which are hereby expressly incorporated by reference into the present application.

TECHNICAL FIELD

The disclosure relates to a semiconductor device manufacturing method and a wire bonding apparatus.

BACKGROUND ART

In manufacturing of semiconductor devices, wire bonding is used commonly in which electrodes on a semiconductor chip and electrodes on a substrate, for example, are connected electrically using wires. As an aspect of such a wire bonding technique, there is known a wedge bonding system in which a wire is connected to a bonding target without forming a ball at the tip of the wire. In such a wedge bonding system, a first bonding point and a second bonding point are connected using a wire, followed by the wire extending out of the tip of the bonding tool being cut at a portion, so that a wire tail for the next wire bonding is formed at the tip of the bonding tool, and the wire tail is bonded directly to the next first bonding point without a ball forming step.

Given the situation, for example, where the first bonding point is an electrode on a semiconductor chip, however, the tip of the wire tail after bonding to the first bonding point may come into contact with an adjacent electrode and/or a passivation film on the semiconductor chip, resulting in a damage to or a defect of the semiconductor chip.

In order to solve such a problem, there has been proposed a technique, as described in Patent Document 1, for example, in which a member (mold) for bending the tip of a wire tail upward is provided separately from the bonding target and, before bonding to a first bonding point, the bonding tool is moved to above the member for arrangement of the shape of the wire tail. However, this requires the bonding tool to be moved to a position away from the bonding target with each wire bonding and thus is not exactly a simple and efficient manufacturing method. Alternatively, in view of the fact that such a problem can arise only at the first bonding point, it is conceivable to solve the problem through reverse bonding in which bonding is performed in reverse order, which disadvantageously puts a limitation on the order of bonding and thus is not exactly a wire bonding method of a high degree of design freedom.

CITATION LIST

Patent Document

Patent document 1: JP2003-318216A

SUMMARY OF THE DISCLOSURE

Technical Problem

It is hence that the disclosure provides a semiconductor device manufacturing method and a wire bonding apparatus with which the above-described problem can be solved.

Solution to Problem

A semiconductor device manufacturing method according to an aspect of the disclosure is for a semiconductor device having a wire loop for connection between a first bonding point and a second bonding point, the method including: a wire tail contacting step of lowering a bonding tool with a wire tail extending out of the tip thereof to bring the tip of the wire tail into contact with a bonding surface of the semiconductor device; a wire tail bending step of moving the bonding tool in a direction intersecting with the axial direction of the bonding tool to bend the wire tail with the tip of the wire tail in contact with the bonding surface; a first bonding step of lowering the bonding tool to compress a portion of the wire tail at the first bonding point and to form the wire tail into a predetermined shape such that the tip of the wire tail points upward; a wire looping step of moving the bonding tool while paying out the wire to cause the wire to extend in a predetermined shape; a second bonding step of lowering the bonding tool to compress a portion of the wire at the second bonding point; and a wire cutting step of cutting the wire to cause a portion of the wire to extend out of the tip of the bonding tool.

In accordance with the arrangement above, the bonding tool is moved with the tip of the wire tail in contact with the bonding surface to bend the wire tail, and then the bonding tool is lowered to compress a portion of the wire tail at the first bonding point and to form the wire tail into a predetermined shape. This eliminates the need to provide, for example, a separate member for arrangement of the shape of the wire tail and allows the amount of movement of the bonding tool to be reduced. It is therefore possible to prevent the tip of the wire from coming into contact with other adjacent elements at the first bonding point and thereby a damage to or a defect of the semiconductor device from occurring, providing a simple and efficient semiconductor device manufacturing method of a high degree of design freedom.

In the semiconductor device manufacturing method, in the wire tail bending step, the bonding tool can be moved along a wire direction running between the first bonding point and the second bonding point.

In the semiconductor device manufacturing method, in the wire tail bending step, the bonding tool can be moved along the wire direction and in a direction inclined with respect to the bonding surface.

In the semiconductor device manufacturing method, in the wire tail bending step, the bonding tool can be moved along the wire direction and in a direction parallel to the bonding surface.

In the semiconductor device manufacturing method, in the wire tail bending step, the bonding tool can be moved along the wire direction in a manner drawing a predetermined curved trajectory.

In the semiconductor device manufacturing method, in the wire tail bending step, the predetermined curve can be concave toward the bonding surface.

In the semiconductor device manufacturing method, in the wire tail bending step, the predetermined curve can be convex toward the bonding surface.

In the semiconductor device manufacturing method, in the first bonding step, the bonding tool can be lowered in a direction perpendicular to the bonding surface.

In the semiconductor device manufacturing method, in the first bonding step, the bonding tool can be lowered along the wire direction in a manner inclined with respect to the bonding surface.

In the semiconductor device manufacturing method, in the wire tail bending step, the bonding tool can be moved along the wire direction by a distance equal to or greater than the length of the wire tail.

In the semiconductor device manufacturing method, in the first bonding step, the portion of the wire tail can be compressed at an electrode on a semiconductor chip as the first bonding point, and in the second bonding step, the portion of the wire can be compressed at an electrode on a substrate on which the semiconductor chip is mounted as the second bonding point.

A wire bonding apparatus according to an aspect of the disclosure is for manufacturing a semiconductor device having a wire loop for wire-connection between a first bonding point and a second bonding point, the wire bonding apparatus including: a bonding arm movable in a plane parallel to and in a direction perpendicular to a bonding surface; an ultrasonic horn attached to the end of the bonding arm; a bonding tool attached to one end of the ultrasonic horn and inserted with a wire therethrough; and a control unit for controlling the operation of the bonding tool, in which the control unit is configured to perform: a wire tail contacting step of lowering the bonding tool with a wire tail extending out of the tip thereof to bring the tip of the wire tail into contact with a bonding surface of the semiconductor device; a wire tail bending step of moving the bonding tool in a direction intersecting with the axial direction of the bonding tool to bend the wire tail with the tip of the wire tail in contact with the bonding surface; a first bonding step of lowering the bonding tool to compress a portion of the wire tail at the first bonding point and to form the wire tail into a predetermined shape such that the tip of the wire tail points upward; a wire looping step of moving the bonding tool toward the second bonding point while paying out the wire to cause the wire to extend in a predetermined shape; a second bonding step of lowering the bonding tool to compress a portion of the wire at the second bonding point; and a wire cutting step of cutting the wire to cause a portion of the wire to extend out of the tip of the bonding tool.

In accordance with the arrangement above, the control unit of the wire bonding apparatus is configured to move the bonding tool with the tip of the wire tail in contact with the bonding surface to bend the wire tail, and then to lower the bonding tool to compress a portion of the wire tail at the first bonding point and to form the wire tail into a predetermined shape. This eliminates the need to provide, for example, a separate member for arrangement of the shape of the wire tail and allows the amount of movement of the bonding tool to be reduced. It is therefore possible to prevent the tip of the wire from coming into contact with other adjacent elements at the first bonding point and thereby a damage to or a defect of the semiconductor device from occurring, providing a simple and efficient wire bonding apparatus of a high degree of design freedom.

In the wire bonding apparatus, in the wire tail bending step, the bonding tool can be moved along a wire direction running between the first bonding point and the second bonding point.

Advantageous Effects of the Disclosure

In accordance with the disclosure, the shape of a wire tail during wire bonding can be arranged easily and efficiently. It is therefore possible to prevent a damage to or a defect of the semiconductor device from occurring and to provide a semiconductor device manufacturing method and a wire bonding apparatus of a high degree of design freedom that can be processed easily and efficiently.

DESCRIPTION OF EMBODIMENTS

Embodiments of the disclosure will hereinafter be described. In the following description of the drawings, identical or similar components are designated by the same or similar reference symbols. The drawings are illustrative only and the dimensions and geometries of various parts are schematic only, and the technical scope of the disclosure should not be understood as being limited to the embodiments.

Figure 1:
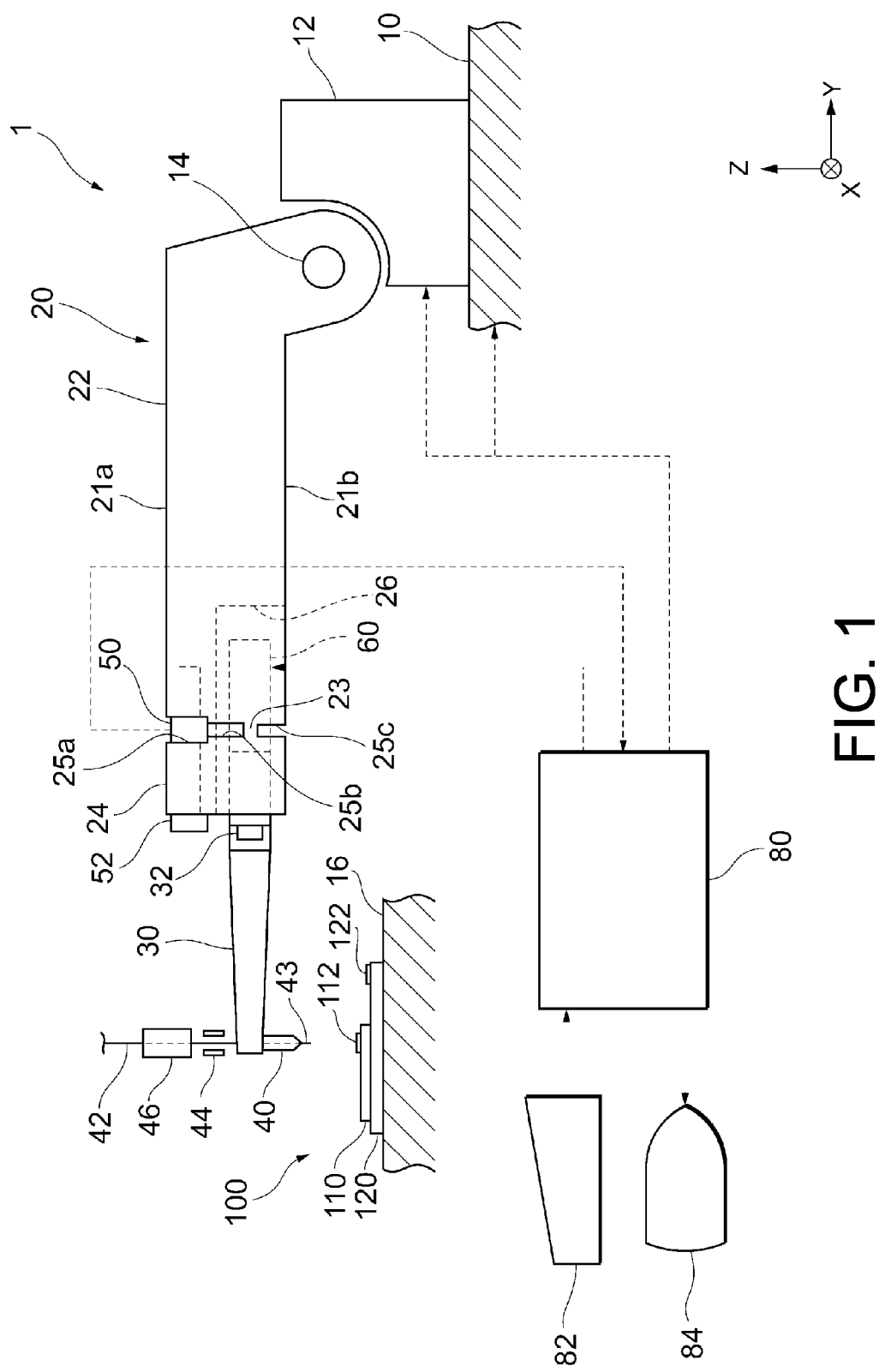
FIG. 1 illustrates a wire bonding apparatus according to an embodiment.
Figure 2A:
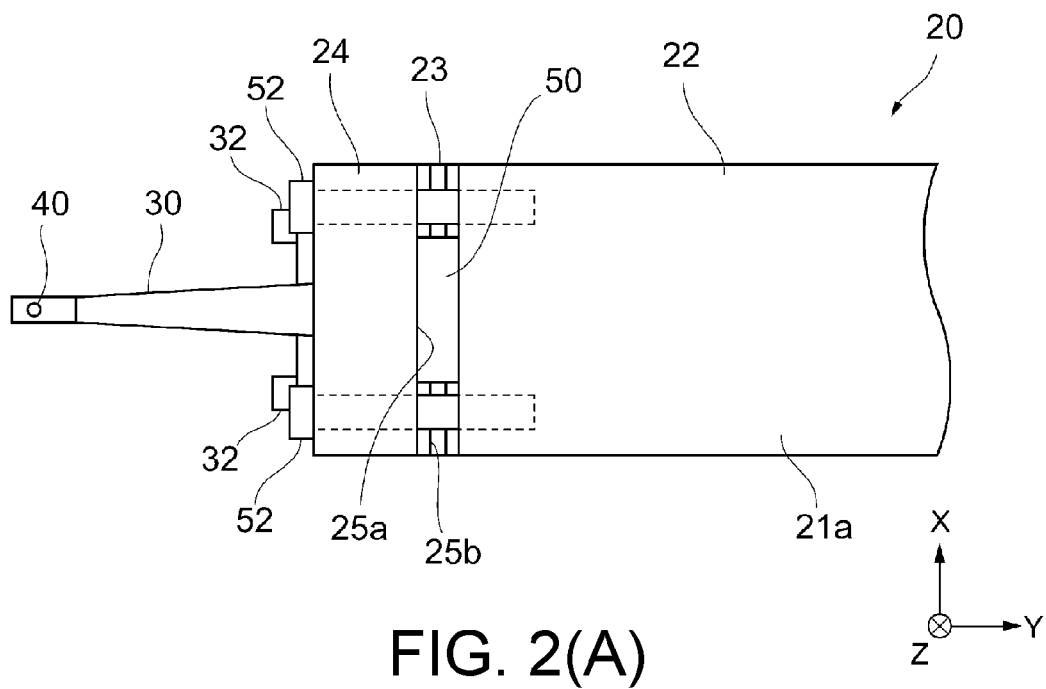
FIGS. 2 (A) and 2 (B) are top and bottom plan views in a plane of a bonding arm of the wire bonding apparatus according to the embodiment.
Figure 2B:
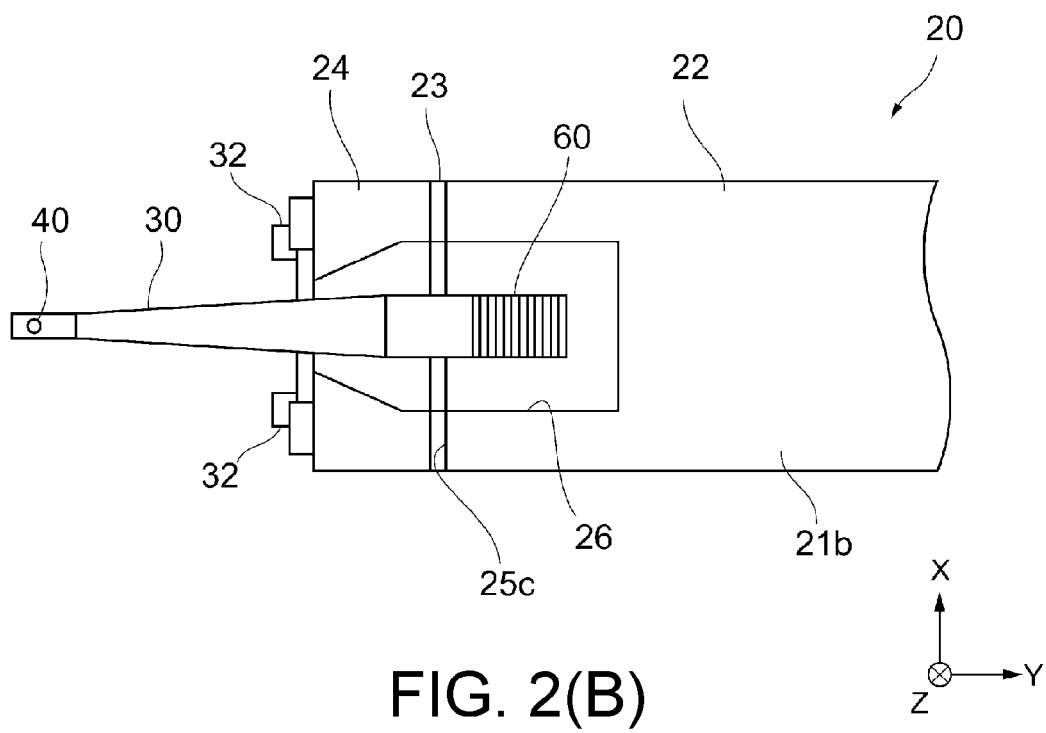

FIG. 1 illustrates a wire bonding apparatus according to an embodiment and FIG. 2 is a partially enlarged view of a bonding arm of the wire bonding apparatus, where FIG. 2 (A) is a top plan view of the bonding arm and FIG. 2 (B) is a bottom plan view of the bonding arm.

As shown in FIG. 1, the wire bonding apparatus 1 includes an XY drive mechanism 10, a Z drive mechanism 12, a bonding arm 20, an ultrasonic horn 30, a bonding tool 40, a load sensor 50, an ultrasonic vibrator 60, and a control unit 80.

The XY drive mechanism 10 is configured to be movable in the X and Y axis directions (planar direction) and the XY drive mechanism (linear motor) 10 is provided with a Z drive mechanism (linear motor) 12 capable of moving the bonding arm 20 in the Z axis direction (vertical direction).

The bonding aim 20 is supported with an arm supporting shaft 14 and configured to be swingable with respect to the XY drive mechanism 10. The bonding arm 20 is formed in an approximately rectangular parallelepiped shape so as to extend from the XY drive mechanism 10 toward a bonding stage 16 on which a bonding target 100 is placed. The bonding target 100 has a bonding surface (onto which wires are bonded) and is placed on the bonding stage 16 such that the bonding surface forms a plane in the XY axes direction. The bonding aim 20 includes an arm base end portion 22 attached to the XY drive mechanism 10, an arm end portion 24 positioned on the end side of the aim base end portion 22 and attached with the ultrasonic horn 30, and a flexible connecting portion 23 connecting the arm base end portion 22 and the arm end portion 24. The connecting portion 23 is constituted with slits 25a and 25b extending in a direction from the top surface 21a toward the bottom surface 21b of the bonding arm 20 and having a predetermined width and a slit 25c extending in a direction from the bottom surface 21b toward the top surface 21a of the bonding arm 20 and having a predetermined width. Since the connecting portion 23 is thus thinned locally with the slits 25a, 25b, and 25c, the arm end portion 24 is flexible with respect to the arm base end portion 22.

As shown in FIGS. 1 and 2 (B), a recessed portion 26 in which the ultrasonic horn 30 is housed is formed in the bottom surface 21b of the bonding arm 20. The ultrasonic horn 30 is housed in the recessed portion 26 of the bonding arm 20 and, in this state, attached to the arm end portion 24 using a horn fixing screw 32. The ultrasonic horn 30 holds, at a end portion thereof extending out of the recessed portion 26, the bonding tool 40, and the ultrasonic vibrator 60 for generating ultrasonic vibrations is provided in the recessed portion 26. Ultrasonic vibrations can be generated by the ultrasonic vibrator 60, transmitted through the ultrasonic horn 30 to the bonding tool 40, and provided through the bonding tool 40 to the bonding target. The ultrasonic vibrator 60 is, for example, a piezoelectric vibrator.

Also, as shown in FIGS. 1 and 2 (A), the slits 25a and 25b are formed in the top surface 21a of the bonding arm 20 in this order from the top surface 21a toward the bottom surface 21b. The upper slit 25a is formed to be wider than the lower slit 25b. The load sensor 50 is then provided in this widely formed upper slit 25a. The load sensor 50 is fixed to the arm end portion 24 using a pre-compressing screw 52. The load sensor 50 is arranged in a manner sandwiched between the arm base end portion 22 and the arm end portion 24. That is, the load sensor 50 is offset from the longitudinal central axis of the ultrasonic horn 30 in a direction toward and away from the bonding target and installed between the center of rotation of the bonding arm 20 and the surface of the aim end portion 24 on which the ultrasonic horn 30 is mounted (i.e. the end surface of the aim end portion 24 on the side of the bonding tool 40). Since the ultrasonic horn 30 holding the bonding tool 40 is then mounted on the arm end portion 24 as mentioned above, the arm end portion 24 undergoes a deflection with respect to the arm base end portion 22 under loading at the end of the bonding tool 40 due to a reaction force from the bonding target, whereby the load sensor 50 can sense a load. The load sensor 50 is, for example, a piezoelectric load sensor.

Figures 4A, 4B:
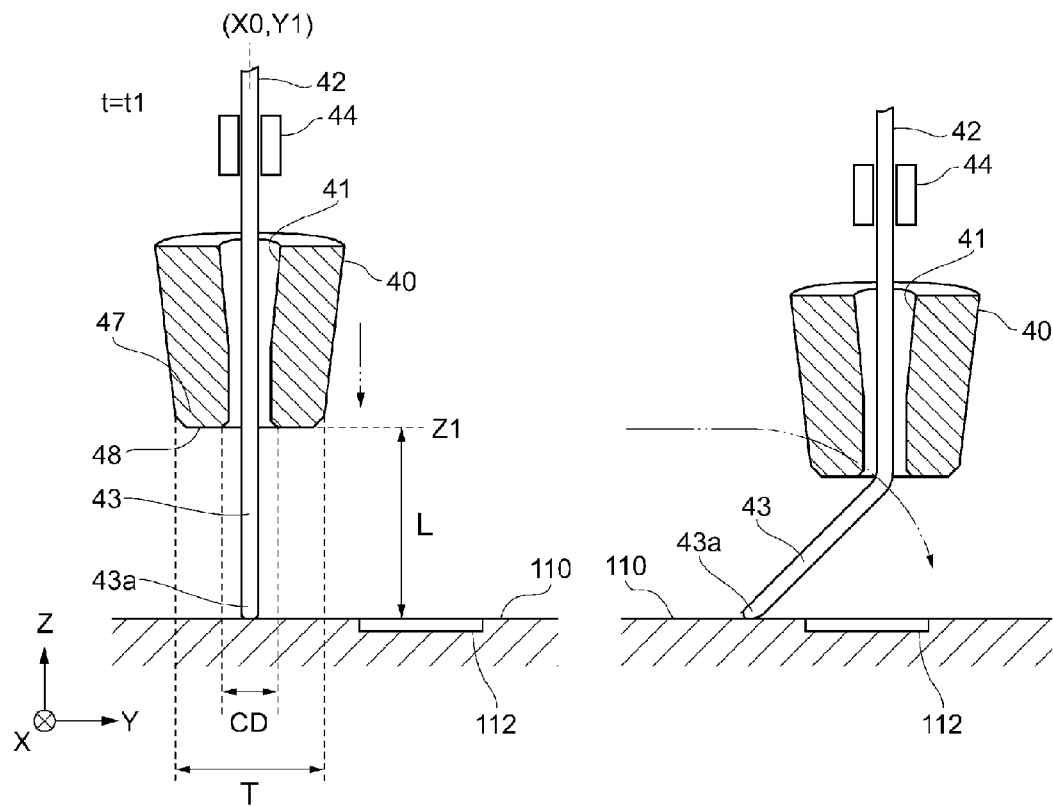
FIGS. 4 (A) to 4 (D) illustrate the semiconductor device manufacturing method according to the embodiment.
Figures 4C, 4D:
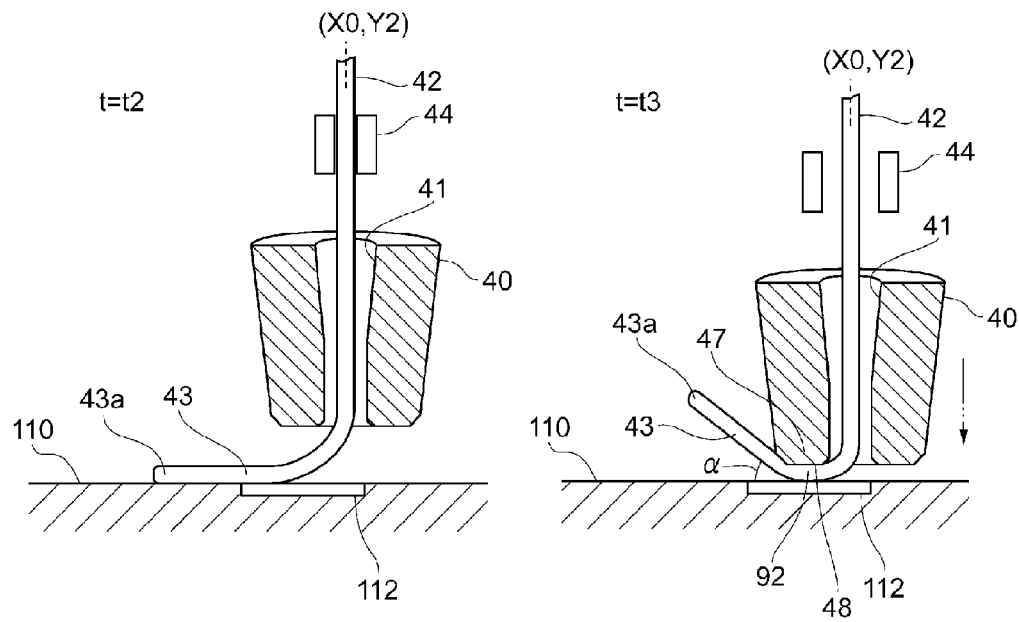

The bonding tool 40 is used for insertion of a wire 42 therethrough and, for example, a capillary provided with an insertion hole 41 as shown in FIG. 4 (A). In this case, the wire 42 for bonding is inserted through the insertion hole 41 of the bonding tool 40, from the tip of which a portion of the wire 42 can be paid out. A pressing portion 47 for pressing the wire 42 is also provided at the tip of the bonding tool 40. The pressing portion 47 has a shape rotationally symmetric about the axial direction of the insertion hole 41 of the bonding tool 40 and has a pressing surface 48 on the underside around the insertion hole 41.

The bonding tool 41 is attached replaceably to the ultrasonic horn 30 with a spring force. Above the bonding tool 40, there is also provided a wire clamper 44 configured to restrain or release the wire 42 at predetermined timing. Above the wire clamper 44, there is further provided a wire tensioner 46 through which the wire 42 is inserted, the wire tensioner 46 configured to give a moderate tension to the wire 42 during bonding.

The material of the wire 42 is selected appropriately for good workability, low electrical resistance, and the like, employing, for example, gold (Au), aluminum (Al), copper (Cu), or silver (Ag). It is noted that a portion (wire tail) 43 of the wire 42, extending out of the tip of the bonding tool 40, is to be bonded to a first bonding point.

Referring again to FIG. 1, the control unit 80 is connected to the XY drive mechanism 10, the Z drive mechanism 12, the ultrasonic horn 30 (ultrasonic vibrator 60), and the load sensor 50 and can control the operation of these components to perform processing required for wire bonding. The control unit 80 includes an interface (not shown) for transmitting and receiving signals to/from components such as the XY drive mechanism 10, the Z drive mechanism 12, the load sensor 50, the ultrasonic horn 30 (ultrasonic vibrator 60), and the wire clamper 44. Specifically, the control unit 80 performs control on the operation of the bonding tool, such as control on the moving distance of the bonding tool 40 in the X, Y, and Z axis directions and the loading in the Z direction, control on the opening and closing operation of the wire clamper 44, the timing, duration, and scrubbing operations of ultrasonic vibrations to be given to the bonding tool 40.

The control unit 80 is also connected with an operation unit 82 for inputting control information and a display unit 84 for outputting control information, with which an operator can input required control information through the operation unit 82 while viewing the screen on the display unit 84. It is noted that the control unit 80 is a computing device including, for example, a CPU and a memory, and that a bonding program or the like for performing processing required for wire bonding is preliminarily stored in the memory. The control unit 80 includes means for performing processing (program for causing the computer to perform processing) for control on the operation of the bonding tool 40 to be described in the semiconductor device manufacturing method below.

Next will be described a semiconductor device manufacturing method according to this embodiment with reference to FIGS. 3 to 7. The semiconductor device manufacturing method is to be implemented using the wire bonding apparatus 1.

Figure 3:
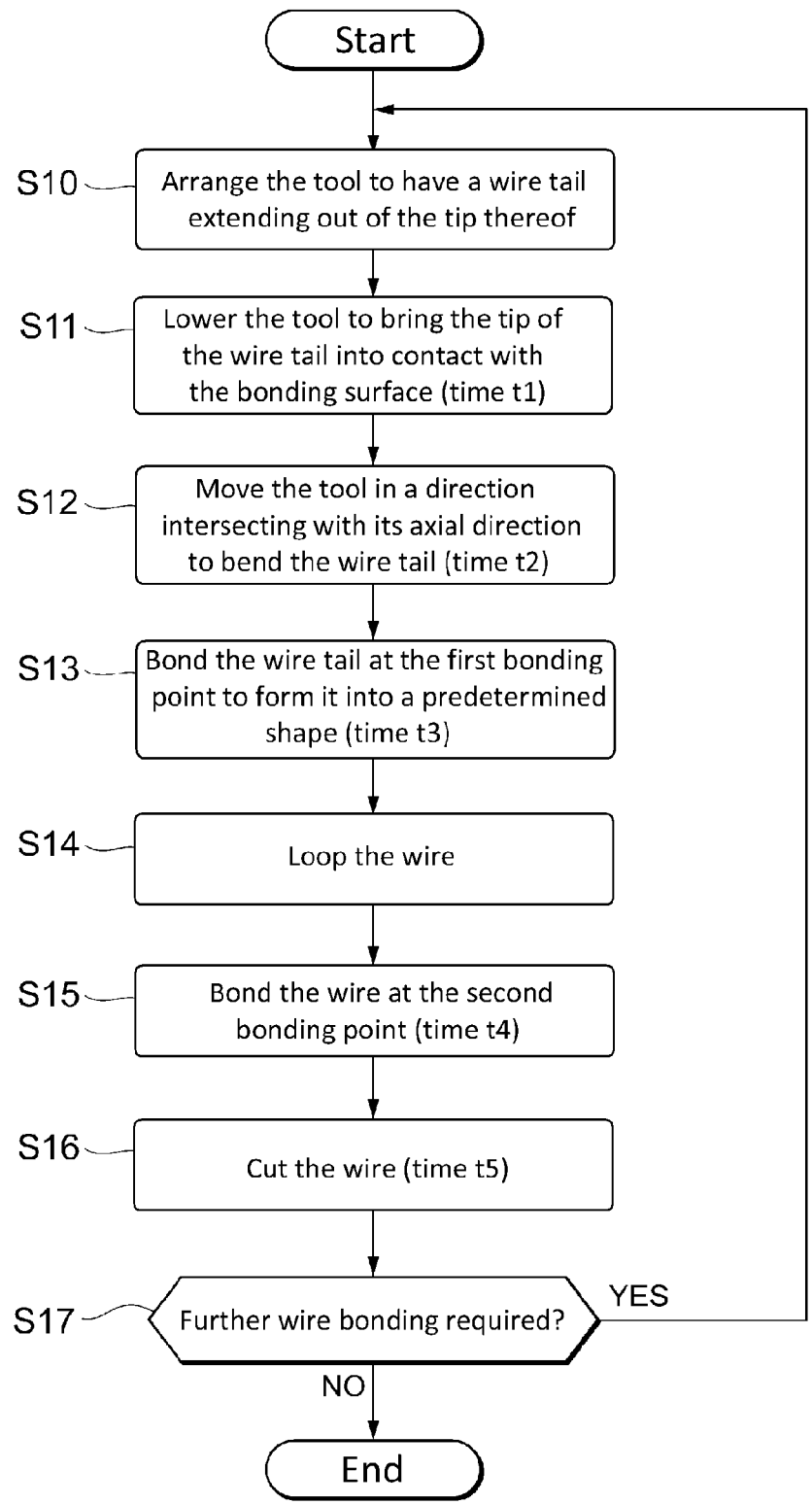
FIG. 3 is a flow chart of a semiconductor device manufacturing method according to the embodiment.
Figure 5A:
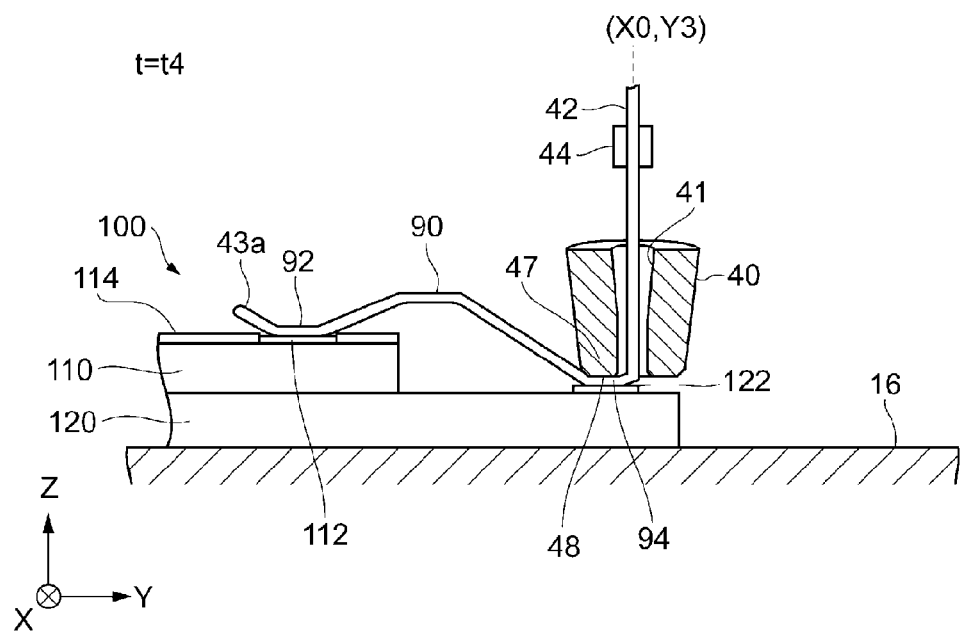
FIGS. 5 (A) and 5 (B) illustrate the semiconductor device manufacturing method according to the embodiment.
Figure 5B:
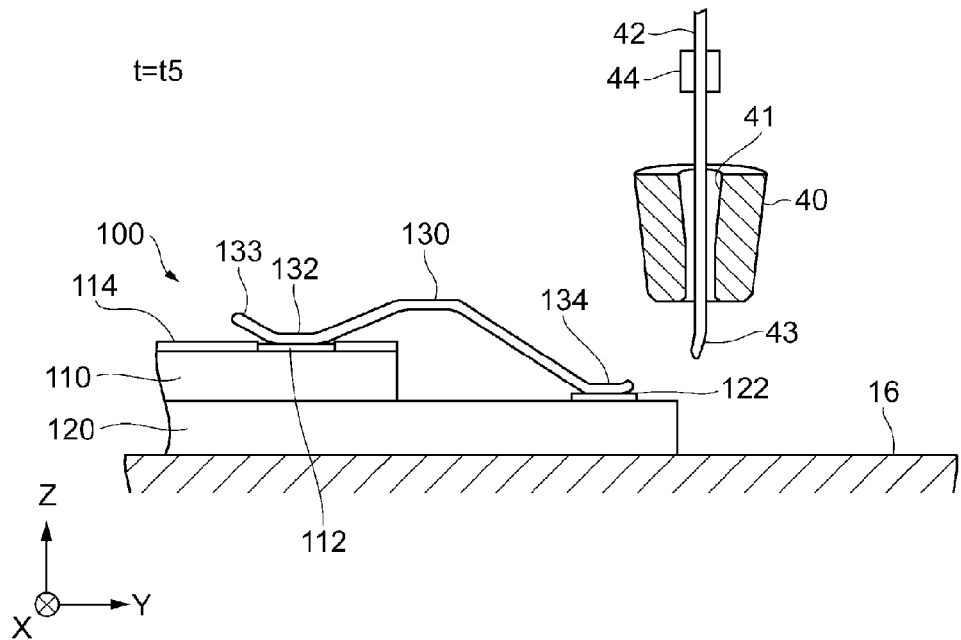
Figure 6:
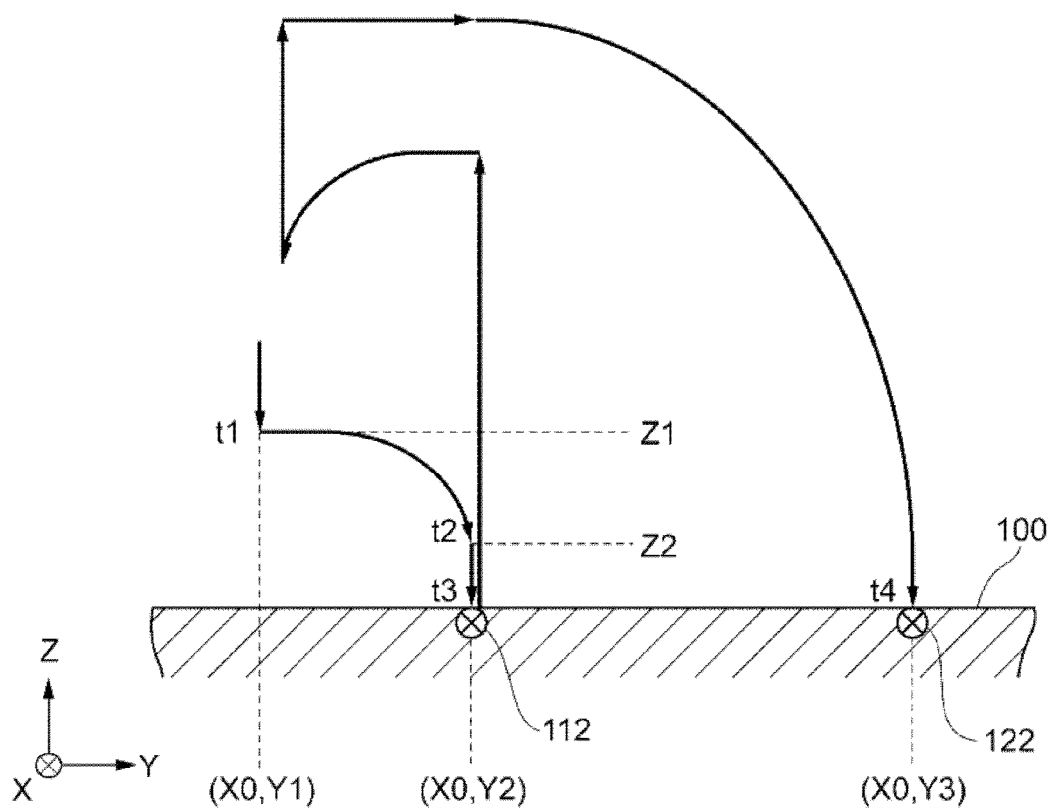
FIGS. 6 illustrates the semiconductor device manufacturing method according to the embodiment.
Figure 7:
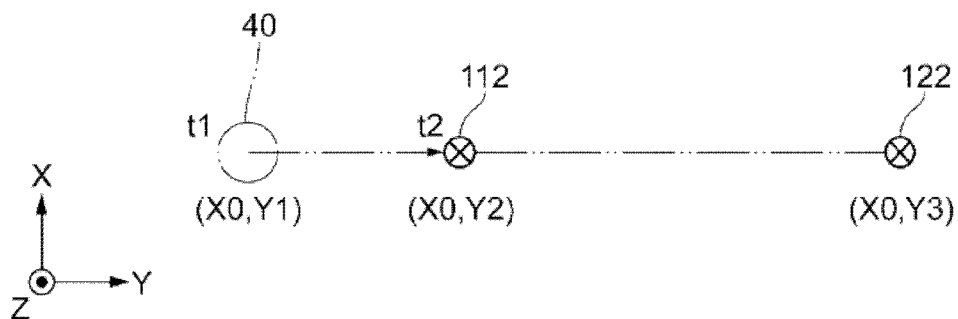
FIGS. 7 illustrates the semiconductor device manufacturing method according to the embodiment.

Here, FIG. 3 is a flow chart of the semiconductor device manufacturing method, and FIGS. 4 (A) to 4 (D) and FIGS. 5 (A) and 5 (B) illustrate each processing of the semiconductor device manufacturing method. Also, FIGS. 6 and 7 illustrate a movement trajectory of the bonding tool.

For the purpose of illustration, the movement trajectory of the bonding tool has a constant X coordinate (X=X0) in the following description. It is noted that the bonding surface (including a first bonding point and a second bonding point) of the semiconductor device, which serves as the bonding target 100, is shown in FIG. 6 on the supposition that the semiconductor chip 110 and the substrate 120 have approximately the same height, though actually having their respective different heights as shown in FIG. 1.

First, the bonding target 100 is provided on the bonding state 16.

As shown in FIG. 1, the bonding target 100 has a first bonding point and a second bonding point to be connected electrically using the semiconductor device manufacturing method of this embodiment. The first bonding point and the second bonding point are arranged on the bonding surface of the bonding target 100, to which wires are to be bonded. Here, the first bonding point refers to the former bonded site of two wire-connected points, while the second bonding point refers to the latter bonded site of the two points. It is noted that "bonding point" in this embodiment is not limited to a single spatial coordinate for bonding, but refers to a region within which the bonding target exists.

The bonding target 100 is a semiconductor device including at least one semiconductor chip, for example, a semiconductor chip 110 having multiple electrodes 112 as the first bonding point and a substrate 120 having multiple electrodes 122 as the second bonding point, as shown in FIG. 1. On the surface of the semiconductor chip 110 on which the electrodes 112 are formed (on which semiconductor elements are formed), there is formed a passivation 114 as a protective film (not shown in FIG. 1; see FIGS. 5 (A) and 5 (B)), and the multiple electrodes 112 are exposed, respectively, through openings in the passivation 114. The semiconductor chip 110 is mounted on the substrate 120, and the electrodes 112 serving as the first bonding point are arranged at a position higher in the Z direction than the electrodes 122 serving as the second bonding point. In this aspect, the bonding in the order from the higher position to the lower position in the Z direction is usually called forward bonding. While an example of such forward bonding will be described hereinafter, the wire bonding of this embodiment can also be applied to so-called reverse bonding in which bonding is performed in the order from the lower position to the higher position in the Z direction.

First, as shown in FIG. 3, the bonding tool 40 is arranged to have a wire tail 43 extending out of the tip thereof (S10).

The bonding tool 40 is, for example, a capillary as shown in FIG. 4 (A) and is provided with an insertion hole 41 along the Z direction, and the wire 42 is inserted through the insertion hole 41. A portion of the wire 42 then extends out of the tip of the bonding tool 40 as the wire tail 43. It is noted that the wire tail 43 preferably extends in the Z direction as shown in FIG. 4 (A) but, without limiting thereto, cab be in a somewhat bent shape, for example.

Next, as shown in FIG. 3, the bonding tool 40 is lowered to bring the tip 43a of the wire tail 43 into contact with the bonding surface of the semiconductor chip 110 (S11).

Specifically, as shown in FIG. 4 (A), the bonding tool 40 is lowered in the Z direction, with the wire clamper 44 being closed, to a height Z1 at which the tip 43a of the wire tail 43 comes into contact with the bonding surface. As shown in FIGS. 4 (A) and 6, the bonding tool 40 is thus arranged at the height Z1 and a plane coordinate (X0, Y1) at time t1.

Here, as shown in FIG. 4 (A), when the wire tail 43 extends in the Z direction, the length L of the wire tail is approximately equal to the height Z1 from the bonding surface. The length L of the wire tail (or the height Z1) can then also be set to satisfy the relational expression $L \geq (T-CD)/2$, for example, where T denotes the width of the bonding tool 40 and CD denotes the opening width of the insertion hole 41. This allows the length of a pressed portion of the wire 42 during first bonding to be described hereinafter to be equal to or greater than the width of the pressing surface 48 of the bonding tool 40, for example.

Next, as shown in FIG. 3, the bonding tool 40 is moved in a direction intersecting with the Z axis direction to bend the wire tail 43 (S12).

Specifically, as shown in FIGS. 4 (B) and 4 (C), the bonding tool 40 is moved, with the tip 43a of the wire tail 43 in contact with the bonding surface, in a manner drawing a predetermined curved trajectory (concave toward the bonding surface). The wire tail 43 is thus bent originating the tip 43a of the wire tail 43 in contact with the bonding surface.

As shown in FIG. 6, the movement trajectory of the bonding tool 40 to time t2 only has to partially include a predetermined curved trajectory. For example, during the earlier part of the time from t1 to t2, the bonding tool 40 can move in the Y direction while remaining at the height Z1 and, during the later part, can move in a manner drawing a predetermined curved trajectory from the height Z1 to a height Z2. The predetermined curved trajectory can be set appropriately based on the spatial coordinates at times t1 and t2 or the setting of the amount of movement of the bonding tool per unit time by the XY drive mechanism 10 and the Z drive mechanism 12 during the time from t1 to t2. For example, the predetermined curved trajectory can be a partial ellipse or circle. As shown in FIGS. 4 (C) and 6, the bonding tool 40 is thus arranged at the height Z2 and a plane coordinate (X0, Y2) at time t2.

Here, the direction of movement of the bonding tool 40 on the XY plane during the time from t1 to t2, though not particularly restrictive, can be along a wire direction running between the first bonding point (electrodes 112) and the second bonding point (electrodes 122) (i.e., the direction in which the wire loop extends that connects the first bonding point and the second bonding point), as shown in FIGS. 6 and 7, for example. This allows the direction of bending of the wire tail 43 with the movement of the bonding tool 40 to be aligned with the wire direction and therefore the orientation of the tip 43a of the wire tail 43 in the XY plane, to be described hereinafter, to be aligned with the wire direction.

The distance of movement (Y2-Y1) of the bonding tool 40 on the XY plane during the time from t1 to t2 can also be equal to or greater than the length L of the wire tail. Thus, upon compression at the first bonding point to be described hereinafter, the tip 43a of the wire tail 43 can eventually be likely to be spaced upward from the bonding surface.

Moving the bonding tool 40 along such a trajectory as indicated by the arrow in FIG. 6 (a predetermined curve concave toward the bonding surface) from time t1 to t3 can reduce the likelihood of the adverse effect that the wire tail 43 might be put back into the insertion hole 41 of the bonding tool 40 as well as prevent the wire tail 43 from sliding on the bonding surface during the time from t1 to t2. It is therefore possible to form the wire tail 43 into a more preferable bent shape easily.

Next, as shown in FIG. 3, the bonding tool 40 is lowered to bond a portion of the wire tail 43 at the first bonding point and to form the wire tail 43 into a predetermined shape (S13).

Specifically, as shown in FIG. 4 (D), the bonding tool 40 is lowered in the Z direction to compress a portion 92 of the wire 42 with the pressing portion 47 (pressing surface 48) of the bonding tool 40 and, as needed, apply heat, ultrasound, and scrubbing operations to bond the wire 42 and the electrodes 112. The compression by the bonding tool 40 then plastically deforms and shapes the tip 43a of the wire tail 43 in a manner pointing upward from the bonding surface. Here, the tip 43a of the shaped wire tail 43 only has to point upward from the bonding surface, including, for example, an aspect in which the tip 43a points slightly obliquely upward from the bonding surface. For example, the angle α between the tip 43a of the wire tail 43 and the bonding surface is only required to have any value within the range of 0<α<90 degrees. As shown in FIG. 4 (D), the bonding at the first boding point is completed and the wire tail 43 is thus formed in a predetermined shape at time t3.

It is noted that the bonding at the first bonding point can be performed with the wire clamper 44 being opened. Also, the height Z2 when the bonding tool 40 starts to be lowered at time t2 can be, for example, a search level at which the rate of lowering of the bonding tool 40 is shifted and can be set appropriately.

Next, as shown in FIG. 3, the bonding tool 40 is moved to loop the wire 42 (S14).

Specifically, as shown in FIG. 6, the bonding tool 40 is raised from the first bonding point (electrodes 112) in the Z direction and moved along such a predetermined trajectory as indicated by the arrows in FIG. 6 to above the second bonding point (electrodes 122 on the substrate 120) while the wire 42 is paid out from the tip of the bonding tool 40. The wire can thus extend in a predetermined loop shape between the first bonding point and the second bonding point.

Next, the bonding tool 40 is lowered to bond a portion of the wire 42 at the second bonding point (S15).

Specifically, as shown in FIG. 5 (A), the bonding tool 40 is lowered, with the wire clamper 44 being closed, at a plane coordinate (X0, Y3) in the Z direction toward the second bonding point. The pressing portion 47 (pressing surface 48) of the bonding tool 40 is then used to compress a portion 94 of the wire 42 and, as needed, heat, ultrasound, and scrubbing operations are applied to bond the wire 42 and the electrodes 122. As shown in FIGS. 5 (A) and 6, the bonding at the second boding point is thus completed to form a wire loop 90 connecting the first bonding point and the second bonding point at time t4.

Next, the bonding tool 40 is moved to cut the wire 42 (S16).

Specifically, as shown in FIG. 5 (B), the wire 42 is cut such that a portion of the wire 42, that is, a new wire tail 43 extends out of the tip of the bonding tool 40. For cutting of the wire, the movement of the bonding tool 40, though not particularly restrictive, can be, for example, such that the bonding tool 40 is moved in a direction away from the second bonding point (e.g. upward in the Z direction) with the wire clamper 44 being opened to pay out the wire 42 from the tip of the bonding tool 40 by a predetermined length that corresponds to the amount of movement of the bonding tool 40, and subsequently the bonding tool 40 is moved in a direction further away from the second bonding point (e.g. upward in the Z direction) with the wire clamper 44 being closed to apply a tensile stress to and cut the wire 42. At least one of the XY drive mechanism 10 and the Z drive mechanism 12 can be activated appropriately to adjust the direction of movement of the bonding tool 40 and thereby to arrange the shape of the new wire tail 43 extending out of the tip of the bonding tool 40 and, at the same time, cut the wire 42. The newly formed wire tail 43 preferably extends in the Z direction as shown in FIG. 5 (B), but can be in a shape bent in a predetermined direction (e.g. wire direction), for example.

Through such processing, there can be formed a wire loop 130 extended in a predetermined shape for connection between the first bonding point and the second bonding point, as shown in FIG. 5 (B). The wire loop 130 has a bonded portion 132 on the electrodes 112 serving as the first bonding point and a bonded portion 134 on the electrodes 122 serving as the second bonding point. The bonded portions 132, 134 are plastically deformed through bonding by the bonding tool 40 (pressing surface 48) so as to have a thickness smaller than the diameter of the wire. The tip 133 of the wire loop 130 then extends in a manner pointing upward from the bonding surface at the first bonding point so as not to come into contact with other adjacent elements (e.g. passivation 114 or other adjacent electrodes).

Subsequently, as shown in FIG. 3, it is determined whether or not further wire bonding is required for the bonding target 100 (S17) and, if required (Yes in S17), the bonding tool 40 is moved to the first bonding point for the next wire bonding to repeat the sequential steps S10 to S16. In contrast, if no further wire bonding is required and the wire bonding for the bonding target 100 is fully completed (No in S17), the wire bonding step for the bonding target 100 is terminated.

It is noted that after the wire cutting step (S16) and before the next S10 step, the new wire tail 43 extending out of the tip of the bonding tool 40 can additionally be shaped in the Z direction, as needed.

As described heretofore, in accordance with this embodiment, the bonding tool 40 is moved with the tip 43a of the wire tail 43 in contact with the bonding surface to bend the wire tail 43, and then the bonding tool 40 is lowered to compress a portion 92 of the wire tail 43 at the first bonding point (electrodes 112) and to form the wire tail 43 into a predetermined shape. This eliminates the need to provide, for example, a separate member for arrangement of the shape of the wire tail 43 and allows the amount of movement of the bonding tool 40 to be reduced. It is therefore possible to prevent the tip 43a of the wire from coming into contact with other adjacent elements (e.g. passivation 114 or other adjacent electrodes) at the first bonding point and thereby a damage to or a defect of the semiconductor device from occurring, providing a simple and efficient semiconductor device manufacturing method of a high degree of design freedom.

The disclosure is not limited to the above-described embodiment, but can be applied in various variations.

The trajectory of movement of the bonding tool 40 during the processing from time t1 to t3 (wire tail bending step and first bonding step) is not limited to the aspect indicated by the arrows in FIG. 6, but can employ various other aspects.

Herein, FIGS. 8 to 11 illustrate variations of the trajectory of movement of the bonding tool 40 during the time from t1 to t3. It is noted that the height, the plane coordinate, and the direction of movement in the XY plane (which can be the wire direction) of the bonding tool at times t1 and t3 are the same as those in the above-described embodiment, but the trajectories of movement of the bonding tool during the time from t1 to t3 are different from the example shown in FIG. 6.

Figure 8:
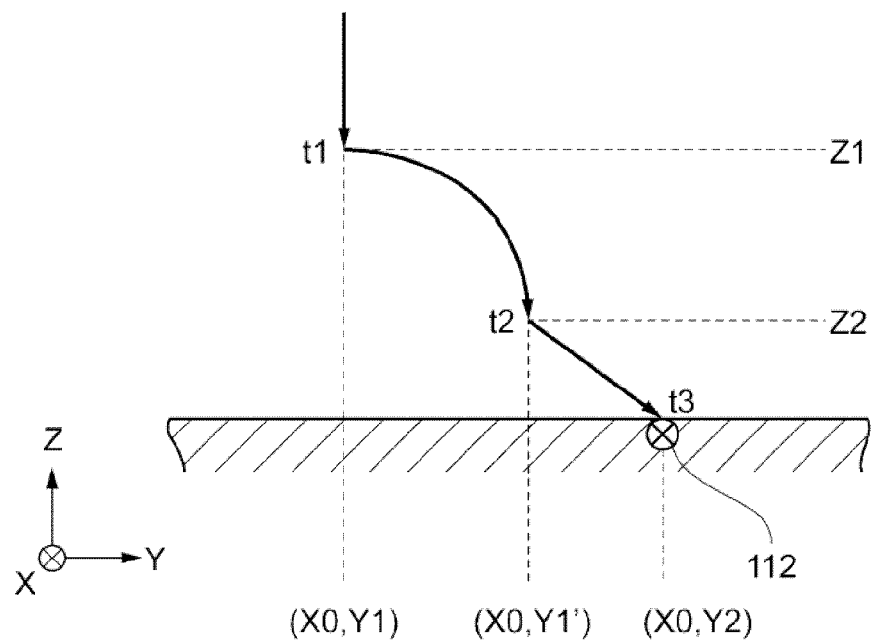
FIGS. 8 illustrates a semiconductor device manufacturing method according to a variation of the embodiment.

For example, as shown in FIG. 8, the bonding tool 40 can be moved in a manner drawing a predetermined curved trajectory (concave toward the bonding surface) with the tip 43a of the wire tail 43 in contact with the bonding surface from time t1 to t2 and arranged at the height Z2 and a plane coordinate (X0, Y1') at time t2, and then lowered in a manner inclined with respect to the bonding surface (XY plane) from time t2 to t3 and, at time t3, a portion of the wire tail 43 can be bonded to the electrodes 112.

This causes the bonding tool 40 to be lowered in a manner inclined with respect to the bonding surface from time t2 to t3 and thus allows the tip 43a of the wire tail 43 to be more likely to be spaced upward from the bonding surface. It is therefore possible to form the wire tail 43 into a predetermined shape more reliably.

Figure 9:
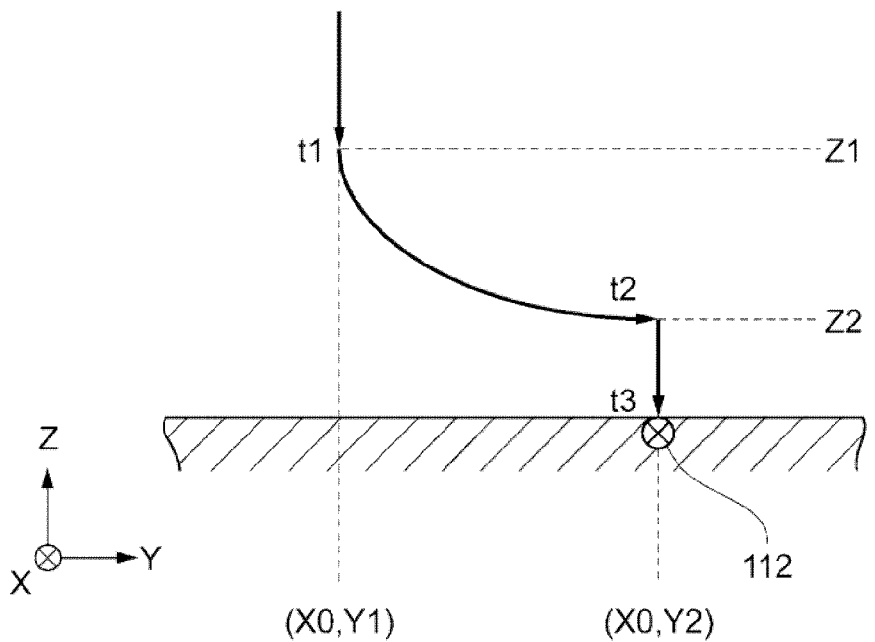
FIGS. 9 illustrates the semiconductor device manufacturing method according to the variation of the embodiment.

Alternatively, as shown in FIG. 9, the bonding tool 40 can be moved in a manner drawing a predetermined curved trajectory (concave toward the side opposite to the bonding surface) with the tip 43a of the wire tail 43 in contact with the bonding surface from time t1 to t2 and arranged at the height Z2 and the plane coordinate (X0, Y2) at time t2, and then lowered in the Z direction from time t2 to t3 and, at time t3, a portion of the wire tail 43 can be bonded to the electrodes 112.

Figure 10:
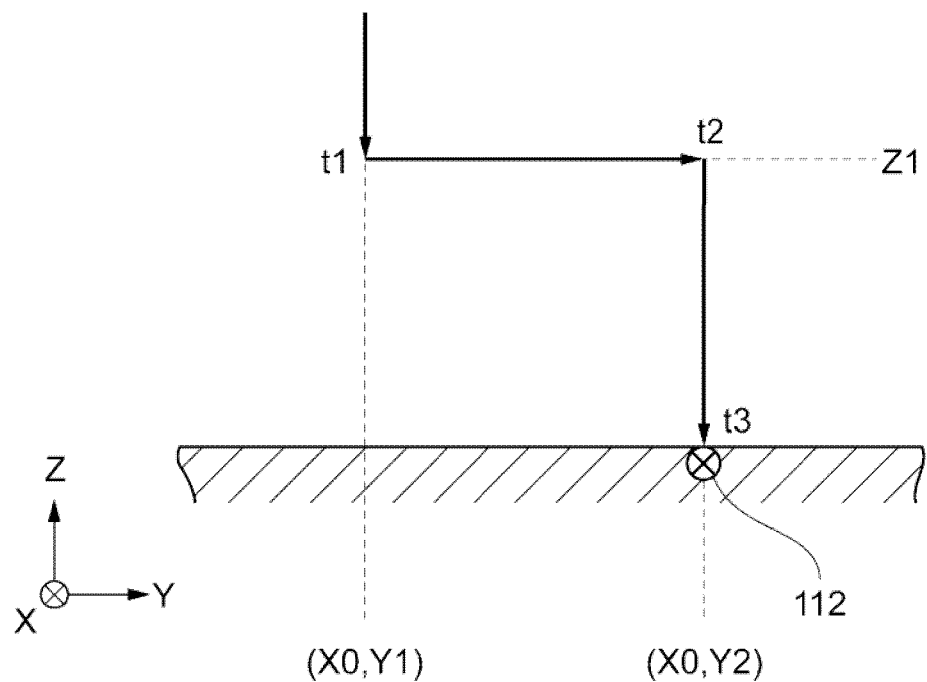
FIGS. 10 illustrates the semiconductor device manufacturing method according to the variation of the embodiment.

Alternatively, as shown in FIG. 10, the bonding tool 40 can be moved in a direction parallel to the bonding surface (XY plane) with the tip 43a of the wire tail 43 in contact with the bonding surface from time t1 to t2 and arranged at the height Z2 and the plane coordinate (X0, Y2) at time t2, and then lowered in the Z direction from time t2 to t3 and, at time t3, a portion of the wire tail 43 can be bonded to the electrodes 112.

Figure 11:
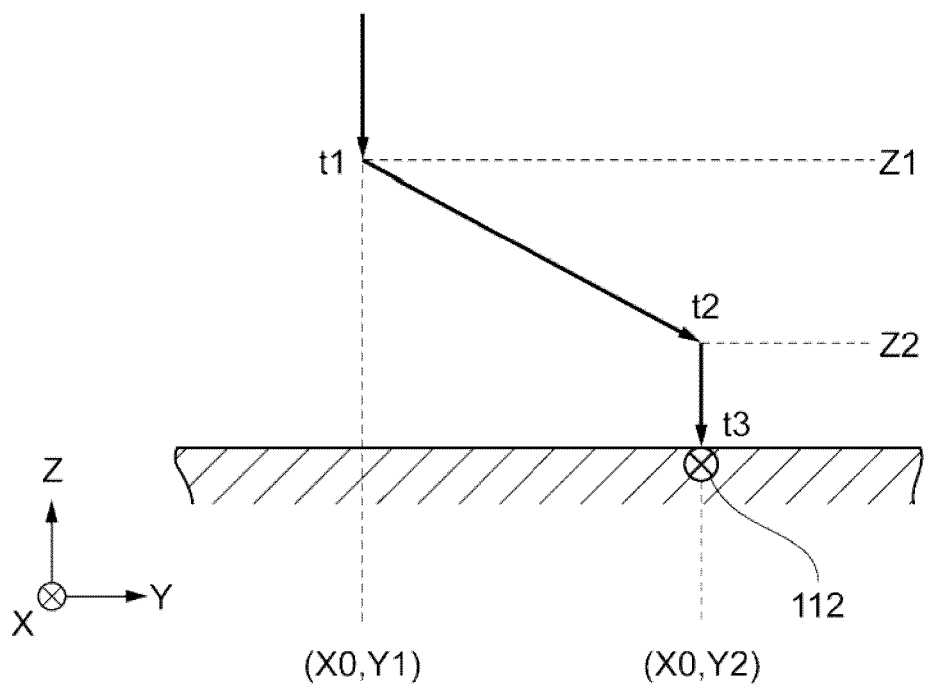
FIGS. 11 illustrates the semiconductor device manufacturing method according to the variation of the embodiment.

Alternatively, as shown in FIG. 11, the bonding tool 40 can be moved in a manner inclined with respect to the bonding surface (XY plane) with the tip 43a of the wire tail 43 in contact with the bonding surface from time t1 to t2 and arranged at the height Z2 and the plane coordinate (X0, Y2) at time t2, and then lowered in the Z direction from time t2 to t3 and, at time t3, a portion of the wire tail 43 can be bonded to the electrodes 112.

It is noted that although the variations shown in FIGS. 9 and 11 have described the case where the bonding tool 40 is lowered in the Z direction from time t2 to t3, in another variation of the examples shown in FIGS. 9 and 11, the bonding tool 40 can be lowered in a manner inclined with respect to the bonding surface (XY plane) from time t2 to t3 and, at time t3, a portion of the wire tail 43 can be bonded to the electrodes 112.

In addition, although the above-described embodiment has described the case where the tip 43a of the wire tail 43 comes into contact with a region on the outside of the electrodes 112 as shown in FIG. 4 (A), the region with which the tip 43a of the wire tail 43 comes into contact can be, for example, on the inside of the electrodes 112. That is, in view of the length L of the wire tail, the size of the electrodes 112, the arranged shape of the wire tail 43 (e.g. the length of the portion extending upward from the bonding surface), or the like, the wire tail can be bent with the tip 43a of the wire tail 43 in contact with a region (included in the bonding surface) on the inside of the electrodes 112.

Further, although the above-described embodiment has described the case of forward bonding in which bonding is performed first to the electrodes 112 on the semiconductor chip serving as the first bonding point and then to the electrodes 122 on the substrate 120 serving as the second bonding point, bonding can reversely be performed first to the electrodes 122 on the substrate 120 serving as the first bonding point and then to the electrodes 112 on the semiconductor chip 110 serving as the second bonding point. In this case, for example, with the tip 43a of the wire tail 43 in contact with a predetermined region on the substrate 120 serving as the bonding surface, the wire tail 43 can be bent originating the contact point from time t1 to t2.

It is noted that the X, Y, and Z-directional movement of the bonding tool 40 is not limited to the arrangements described in the examples of the above-described embodiment. The geometry of the bonding tool 40 is also not limited to that shown.

The examples and applications described through the above-described embodiments of the disclosure can be combined appropriately depending on the intended use or can be changed or modified for use, and the disclosure is not limited to the description of the above embodiments. It is obvious from the description of the appended claims that such combined, changed, or modified modes could also be included within the technical scope of the disclosure.

The invention claimed is:

1. A semiconductor device manufacturing method of a semiconductor device having a wire loop for connection between a first bonding point and a second bonding point, the method comprising:
   a wire tail contacting step of lowering a bonding tool with a wire tail extending out of a tip of the bonding tool to bring a tip of the wire tail into contact with a bonding surface of the semiconductor device;
   a wire tail bending step of moving the bonding tool in a direction intersecting with an axial direction of the bonding tool to bend the wire tail with the tip of the wire tail in contact with the bonding surface;
   a first bonding step of lowering the bonding tool to compress a portion of the wire tail at the first bonding point and to form the wire tail into a predetermined shape such that the tip of the wire tail points upward;
   a wire looping step of moving the bonding tool while paying out a wire to cause the wire to extend in a predetermined shape;
   a second bonding step of lowering the bonding tool to compress a portion of the wire at the second bonding point; and
   a wire cutting step of cutting the wire to cause a portion of the wire to extend out of the tip of the bonding tool.

2. The semiconductor device manufacturing method according to claim 1, wherein in the wire tail bending step, the bonding tool is moved along a wire direction running between the first bonding point and the second bonding point.

3. The semiconductor device manufacturing method according to claim 2, wherein in the wire tail bending step, the bonding tool is moved along the wire direction and in a direction inclined with respect to the bonding surface.

4. The semiconductor device manufacturing method according to claim 2, wherein in the wire tail bending step, the bonding tool is moved along the wire direction and in a direction parallel to the bonding surface.

5. The semiconductor device manufacturing method according to claim 2, wherein in the wire tail bending step, the bonding tool is moved along the wire direction in a manner drawing a predetermined curved trajectory.

6. The semiconductor device manufacturing method according to claim 5, wherein in the wire tail bending step, the predetermined curve is concave toward the bonding surface.

7. The semiconductor device manufacturing method according to claim 5, wherein in the wire tail bending step, the predetermined curve is convex toward the bonding surface.

8. The semiconductor device manufacturing method according to claim 2, wherein in the first bonding step, the bonding tool is lowered in a direction perpendicular to the bonding surface.

9. The semiconductor device manufacturing method according to claim 2, wherein in the first bonding step, the bonding tool is lowered along the wire direction in a manner inclined with respect to the bonding surface.

10. The semiconductor device manufacturing method according to claim 2, wherein in the wire tail bending step, the bonding tool is moved along the wire direction by a distance equal to or greater than a length of the wire tail.

11. The semiconductor device manufacturing method according to claim 2, wherein
- in the first bonding step, the portion of the wire tail is compressed at an electrode on a semiconductor chip as the first bonding point, and
- in the second bonding step, the portion of the wire is compressed at an electrode on a substrate on which the semiconductor chip is mounted as the second bonding point.

12. A wire bonding apparatus for manufacturing a semiconductor device having a wire loop for wire-connection between a first bonding point and a second bonding point, the wire bonding apparatus comprising:
- a bonding arm movable in a plane parallel to and in a direction perpendicular to a bonding surface;
- an ultrasonic horn attached to an end of the bonding arm;
- a bonding tool attached to one end of the ultrasonic horn and inserted with a wire therethrough; and
- a control unit for controlling an operation of the bonding tool, wherein the control unit is configured to perform:
  - a wire tail contacting step of lowering the bonding tool with a wire tail extending out of a tip of the bonding tool to bring a tip of the wire tail into contact with a bonding surface of the semiconductor device;
  - a wire tail bending step of moving the bonding tool in a direction intersecting with an axial direction of the bonding tool to bend the wire tail with the tip of the wire tail in contact with the bonding surface;
  - a first bonding step of lowering the bonding tool to compress a portion of the wire tail at the first bonding point and to form the wire tail into a predetermined shape such that the tip of the wire tail points upward;
  - a wire looping step of moving the bonding tool toward the second bonding point while paying out a wire to cause the wire to extend in a predetermined shape;
  - a second bonding step of lowering the bonding tool to compress a portion of the wire at the second bonding point; and
  - a wire cutting step of cutting the wire to cause a portion of the wire to extend out of the tip of the bonding tool.

13. The wire bonding apparatus according to claim 12, wherein in the wire tail bending step, the bonding tool is moved along a wire direction running between the first bonding point and the second bonding point.

\* \* \* \* \*